(12) United States Patent  
Nagakura (10) Patent No.: US 8,987,145 B2
(45) Date of Patent: Mar. 24, 2015

(54) SEMICONDUCTOR DEVICE, MANUFACTURING METHOD OF THE SEMICONDUCTOR DEVICE

(75) Inventor: Kotaro Nagakura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/001,732

(22) PCT Filed: Mar. 2, 2012

(86) PCT No.: PCT/JP2012/001449
§ 371 (c)(1),
(2), (4) Date: Aug. 27, 2013

(87) PCT Pub. No.: WO2012/120857
PCT Pub. Date: Sep. 13, 2012

(65) Prior Publication Data
US 2013/0334661 A1    Dec. 19, 2013

(30) Foreign Application Priority Data

Mar. 4, 2011 (JP) ................................ 2011-048295

(51) Int. Cl.
 *H01L 21/302* (2006.01)
 *H01L 49/02* (2006.01)
 *H01L 21/311* (2006.01)
 (Continued)

(52) U.S. Cl.
 CPC ............... *H01L 28/60* (2013.01); *H01L 28/40* (2013.01); *H01L 21/31111* (2013.01); *H01L 21/32105* (2013.01); *H01L 27/0629* (2013.01)
 USPC .................................. 438/756; 257/E21.221

(58) Field of Classification Search
 USPC ......... 438/253, 381, 387, 396, 745, 750, 756; 257/E21.221
 See application file for complete search history.

(56) References Cited

U.S. PATENT DOCUMENTS 5,632,855 A * 5/1997 Jones et al. .................... 438/714
5,876,788 A   3/1999 Bronner et al.
(Continued)

FOREIGN PATENT DOCUMENTS

CN    101228613 A    7/2008
CN    101345189 A    1/2009
(Continued)

OTHER PUBLICATIONS

International Preliminary Report on Patentability dated Sep. 19, 2013, for the corresponding international application No. PCT/JP2012/001449.
(Continued)

*Primary Examiner* — Quoc Hoang
(74) *Attorney, Agent, or Firm* — Morgan, Lewis & Bockius LLP (57) ABSTRACT

A two-layered polysilicon capacitive element is manufactured to enable suppression of both of an increase in the applied electric field dependence of the capacitance value and the initial defect of the dielectric film. Included are a lower electrode into which phosphorous ions are implanted, a dielectric film formed on the lower electrode, and an upper electrode formed on the dielectric film. The dielectric film includes a thermal oxide film formed by partially oxidizing a polysilicon film constituting the lower electrode and etching out its outer layer part, and a deposited oxide film formed on the thermal oxide film.

8 Claims, 5 Drawing Sheets

(51) Int. Cl.
*H01L 21/321* (2006.01)
*H01L 27/06* (2006.01)

(56) References Cited

U.S. PATENT DOCUMENTS

| | | | |
|---|---|---|---|
| 6,914,013 B2 * | 7/2005 | Chung | ............... 438/770 |
| 2003/0109134 A1 | 6/2003 | Yuzuriha | |
| 2005/0255711 A1 | 11/2005 | Sugawara et al. | |
| 2009/0014028 A1 | 1/2009 | Hirota et al. | |
| 2009/0130816 A1 | 5/2009 | Takahashi et al. | |

FOREIGN PATENT DOCUMENTS

| | | | |
|---|---|---|---|
| JP | 63-060550 | A | 3/1988 |
| JP | 02-072658 | A | 3/1990 |
| JP | 03-009556 | A | 1/1991 |
| JP | 03-280466 | A | 12/1991 |
| JP | 05-291499 | A | 11/1993 |
| JP | 06-069522 | A | 3/1994 |
| JP | 07-058290 | A | 3/1995 |
| JP | 2000-138347 | A | 5/2000 |
| TW | 373340 | | 11/1999 |
| TW | 388098 | B | 4/2000 |
| TW | 594867 | B | 6/2004 |

OTHER PUBLICATIONS

International Search Report dated Mar. 27, 2012 for International Application No. PCT/JP2012/001449.

Japanese Office Action dated Sep. 17, 2013 for corresponding Japanese Patent Application No. 2013-503384.

* cited by examiner

SEMICONDUCTOR DEVICE, MANUFACTURING METHOD OF THE SEMICONDUCTOR DEVICE

TECHNICAL FIELD

The present invention relates to a semiconductor device in relation to a semiconductor capacitive element having polysilicon with its resistance lowered and a silicon oxide film as a dielectric.

BACKGROUND ART

A capacitive element constituted of two-layered polysilicon (hereinafter, referred to as two-layered polysilicon capacitive element) is known as one of the capacitive elements of a semiconductor integrated circuit. The two-layered polysilicon capacitive element has a structure in which a silicon oxide film to be a dielectric is interposed between an upper electrode and a lower electrode.

A polysilicon film with its resistance lowered by doping impurities such as phosphorous or the like is used for the upper electrode and the lower electrode of the two-layered polysilicon capacitive element, in many cases. The silicon oxide film between the upper electrode and the lower electrode is formed by, in general, partially oxidizing the polysilicon film that is the lower electrode.

It is to be noted that, however, that the impurities remain in the silicon oxide film formed by thermally oxidizing directly the polysilicon film including the impurities such as phosphorous or the like. This poses disadvantages of degrading the breakdown voltage of the two-layered polysilicon capacitive element or causing the initial defect.

The above disadvantages are suppressed by reducing the concentration of impurities to be doped into the polysilicon film. If the concentration of impurities is reduced, however, another problem will be developed such that the depletion of the electrode cannot be suppressed and the applied electric field dependence of the capacitance value in the two-layered polysilicon capacitive element is increased.

As a conventional technique of the two-layered polysilicon capacitive element having a low applied electric field dependence of the capacitance value, "An insulating film manufacturing method of a semiconductor device" described in Patent Document 1 is known by way of example. In the semiconductor capacitance device described in Patent Document 1, the laminated structure of a thermal silicon oxide film and a silicon oxide film deposited by a low-pressure Chemical Vapor Deposition (CVD) process is used as a dielectric.

In addition, in the semiconductor capacitance device described in Patent Document 2, a silicon nitride film deposited by the CVD process is used as the dielectric. Furthermore, in the semiconductor device described in Patent Document 3, a silicon nitride film deposited by the low-pressure CVD process is formed as the dielectric. Moreover, in the semiconductor capacitance device described in Patent Document 4, non-doped amorphous silicon thermally oxidizing or thermally nitrided is used as the dielectric.

PRIOR ART DOCUMENTS

Patent Documents

Patent Document 1: JP H03-280466 A
Patent Document 2: JP H06-69522 A
Patent Document 3: JP H05-291499 A
Patent Document 4: JP H02-72658 A

SUMMARY OF THE INVENTION

Problem to be Solved by the Invention

In the invention described in Patent Document 1, however, the thermal silicon oxide film and the deposited silicon oxide film are used in combination to form the dielectric. Although the deposited silicon oxide film does not include the impurities and the concentration of the impurities in the whole dielectric is suppressed, the thermal silicon oxide film includes a large amount of impurities and the defect cannot be suppressed sufficiently.

In the invention of the above-described Patent Document 2, since the deposited silicon nitride film has more defects caused by hydrogen incorporated at the time of deposition than those of the silicon oxide film formed by the thermal oxidization, the degradation of the breakdown voltage is worried about.

In the invention of the above-described Patent Document 3, in addition to the silicon nitride film having lots of defects, the silicon oxide film obtained by thermally oxidizing the entire phosphorous-doped polysilicon deposited thereon is used. Hence, the whole amount of phosphorous that is doped remains in the dielectric and causes a defect.

Besides, in the invention of the above-described Patent Document 4, if the diffusion of phosphorous from underlying phosphorous-doped polysilicon to non-doped amorphous silicon is not enough at the time of thermally oxidizing the non-doped amorphous silicon, the concentration of phosphorous in the vicinity of the boundary of the dielectric and polysilicon is reduced. This causes a drawback of increasing the applied electric field dependence of the capacitance value.

The present invention has been made in view of the above circumstances and has an object to provide a semiconductor device constituted as a two-layered polysilicon capacitive element in which both of an increase in the applied electric field dependence of the capacitance value and the initial defects can be suppressed, and a manufacturing method of the semiconductor device.

Solution to the Problem

Figure 1:
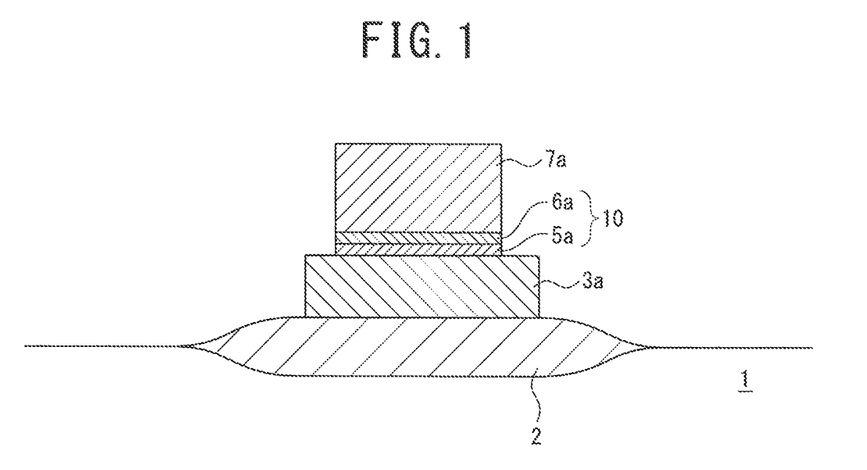
FIG. 1 is a view illustrative of a structure of a semiconductor device according to an embodiment of the present invention.

In order to solve the above-described problem, according to an aspect of the present invention, there is provided a semiconductor device comprising: a lower electrode constituted of a first polysilicon film into which impurities are implanted (for example, a lower electrode 3a illustrated in FIG. 1); a dielectric film formed on the lower electrode (for example, a dielectric film 10 illustrated in FIG. 1); an upper electrode formed on the dielectric film and constituted of a second polysilicon film (for example, an upper electrode 7a illustrated in FIG. 1), the dielectric film comprising: a thermal oxide film formed by partially oxidizing the lower electrode to partially remove a surface of the lower electrode in a depth direction (for example, a thermal oxide film 5a illustrated in FIG. 1); and a deposited oxide film formed on the thermal oxide film (for example, a deposited oxide film 6a illustrated in FIG. 1).

Figure 21:
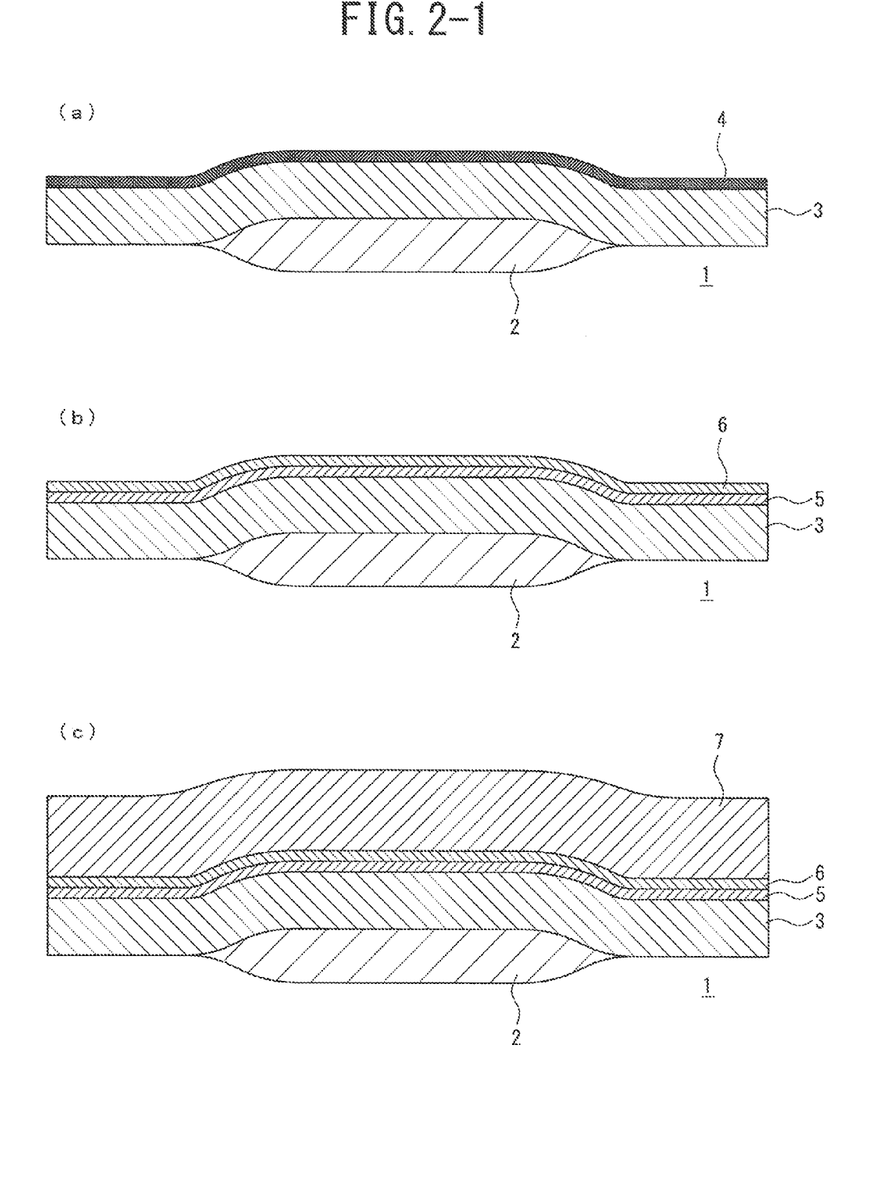

According to another aspect of the present invention, there is provided a manufacturing method of a semiconductor device, comprising processes of: forming a first polysilicon film on a field oxide film formed on a substrate; implanting impurities into the first polysilicon film (for example, the process illustrated in FIG. 2-1(a)); oxidizing the first polysilicon film to form a thermal oxide film (for example, the process illustrated in FIG. 2-1(b)); etching a whole surface of the thermal oxide film in a depth direction (for example, the process illustrated in FIG. 2-1(*b*)); forming a deposited oxide film on the thermal oxide film that is etched (for example, the process illustrated in FIG. 2-1(*b*)); and forming a second polysilicon film on the deposited oxide film (for example, the process illustrated in FIG. 2-1(*c*)).

Figure 22:
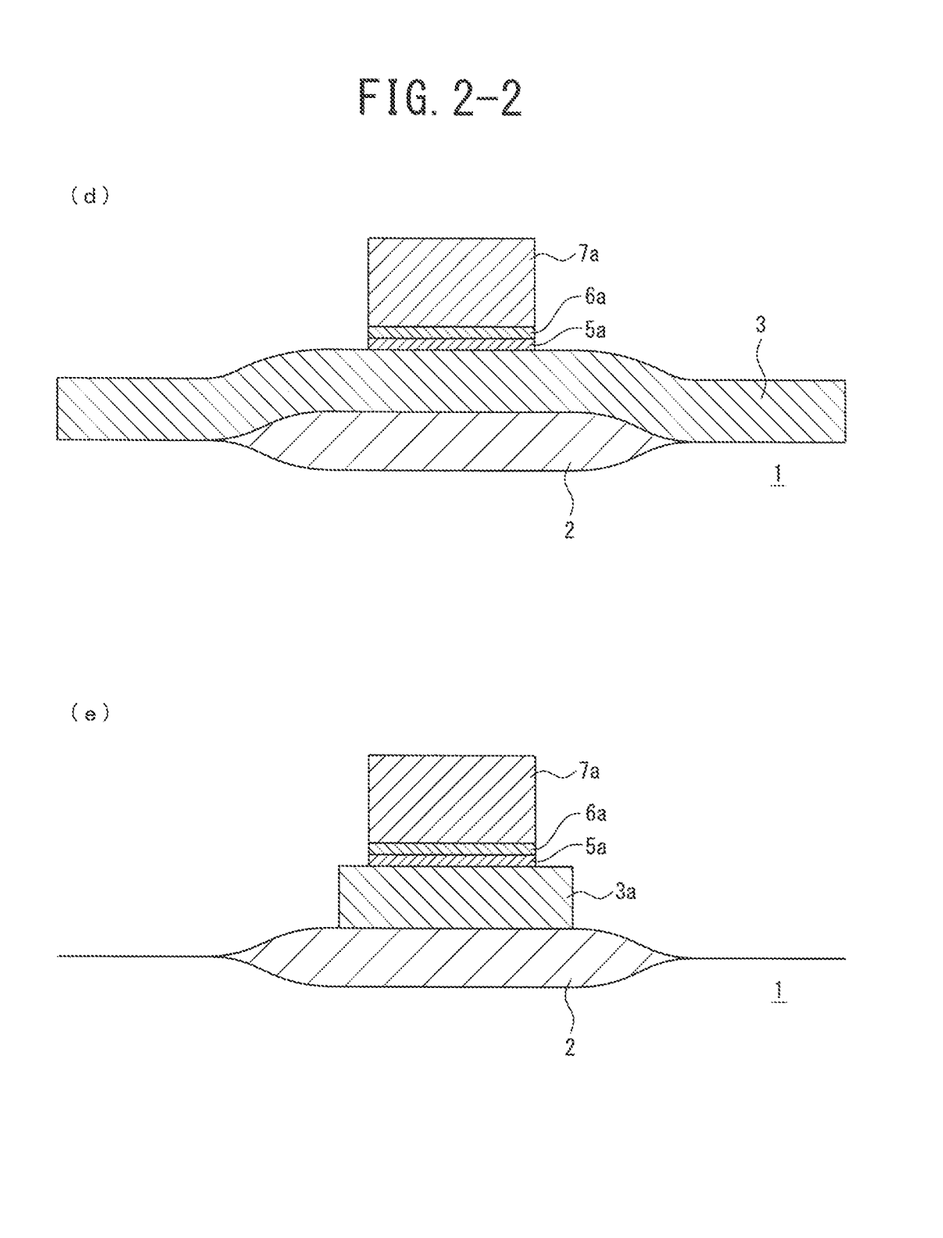

The above-described manufacturing method of the semiconductor device may further comprise processes of: patterning the second polysilicon film, the thermal oxide film, and the deposited oxide film to form an upper electrode and a dielectric film (for example, the process illustrated in FIG. 2-2 (*d*)); and patterning the first polysilicon film to form a lower electrode (for example, the process illustrated in FIG. 2-2 (*e*)).

According to the above aspect of the present invention, in the above-described manufacturing method of the semiconductor device, it is possible to provide the manufacturing method of the semiconductor device constituted as a two-layered polysilicon capacitive element in which both of an increase in the applied electric field dependence of the capacitance value and the initial defect can be suppressed.

In the above-described manufacturing method of the semiconductor device, preferably, in the process of forming the thermal oxide film, the thermal oxide film having thickness of substantially 12 nm is formed at a temperature of 1050 degrees Celsius.

According to the above aspect of the present invention, in the above-described manufacturing method of the semiconductor device, the film forming condition of the thermal oxide film most suitable for the dielectric film is obtainable.

In the above-described manufacturing method of the semiconductor device, preferably, in the process of etching the thermal oxide film, wet etching is performed by: an ammonia-hydrogen peroxide mixture of $NH_2(aq):H_2O:H_2O_2=1:10:2$ at 50 degrees Celsius; a hydrochloric acid-hydrogen peroxide mixture of $HCL:H_2O:H_2O_2=1:5:1$ at 80 degrees Celsius; and a hydrogen fluoride solution of $HF:H_2O=1:99$ at 23 degrees Celsius, or wet etching is performed by only the hydrogen fluoride solution of $HF:H_2O=1:99$ at 23 degrees Celsius, to etch out the thermal oxide film from an outermost surface to a range of 1 nm or more to 4 nm or less in the depth direction.

According to the above aspect of the present invention, in the above-described manufacturing method of the semiconductor device, the wet etching condition of the thermal oxide film most suitable for the dielectric film is obtainable.

In the above-described manufacturing method of the semiconductor device, preferably, in the process of forming the deposited oxide film, the deposited oxide film having thickness of substantially 10 nm is formed by using the low-pressure CVD process under a condition of pressure 100 Pa, at 670 degrees Celsius.

According to the above aspect of the present invention, in the above-described manufacturing method of the semiconductor device, the film forming condition of the deposited oxide film most suitable for the dielectric film is obtainable.

Advantageous Effects of the Invention

The inventor of the present invention has repeatedly conducted studies and researches earnestly to solve the above-described problem, and finally found out that both of an increase in the voltage dependency and the initial defect can be suppressed by: forming a polysilicon film, introducing phosphorous into the polysilicon film by ion implantation to lower the resistance thereof, forming a thermal oxide film by thermal oxidization, wet etching the outer layer part of the oxide film including phosphorous of high concentration by a hydrogen fluoride solution, and performing low-pressure CVD process to supplement the film thickness with the deposited oxide film.

Based upon the foregoing, according to an aspect of the present invention, there is provided a semiconductor device constituted as a two-layered polysilicon capacitive element in which it is possible to suppress both of an increase in the applied electric field dependence of the capacitance value and the initial defect, and a manufacturing method of the semiconductor device.

BRIEF DESCRIPTION OF THE DRAWINGS

FIG. 2-1 (*a*) to (*c*) are cross-sectional views illustrative of a manufacturing method of the semiconductor device successively in accordance with manufacturing processes, according to an embodiment of the present invention;

FIG. 2-2 (*d*) to (*e*) are cross-sectional views illustrative of the manufacturing method of the semiconductor device subsequently to the processes illustrated in FIG. 2-1 (*a*) to (*c*), successively in accordance with the manufacturing processes, according to an embodiment of the present invention;

DESCRIPTION OF EMBODIMENTS

Hereinafter, an embodiment of the present invention will be described specifically.

(A Semiconductor Device)

FIG. 1 is a view illustrative of the semiconductor device according to the present embodiment. The semiconductor device illustrated includes: a lower electrode 3*a* constituted of a polysilicon film into which phosphorus ions (P+) are implanted as impurities; a dielectric film 10 formed on the lower electrode 3*a*; and an upper electrode 7*a* formed on the dielectric film 10 and constituted of a polysilicon film into which phosphorus ions (P+) are implanted as the impurities. The dielectric film 10 includes: a thermal oxide film 5*a* constituted of a thermal oxide film formed by partially oxidizing the polysilicon film; and a deposited oxide film 6*a* constituted of a deposited oxide film formed on the thermal oxide film 5*a*.

In the present embodiment, an outer layer part of the thermal oxide film 5*a* is etched. Herein, in the present embodiment, the thermal oxide film 5*a* is etched to equal to or more than 1 nm from the outermost surface and such an etched part is removed (etched out). In the present embodiment, a range in the thermal oxide film 5*a* to be etched out is referred to as the "outer layer part".

As described heretofore, according to the present embodiment, the minimum amount to be etched out is 1 nm from the outermost surface of the thermal oxide film 5*a*. Also, in the present embodiment, the maximum amount to be etched out is equal to or less than 4 nm. Such a range of the outer layer part is defined, because when the wet etching amount of the thermal oxide film is set to less than 1 nm, the initial defect density cannot be suppressed sufficiently. Besides, it is known that phosphorous to be a cause of the initial defect is generally existent to the depth of 4 nm of the oxide film. Even if the thermal oxide film is etched out by equal to or more than 4 nm, it is presumable that the defect density cannot be made smaller.

Also, in the present embodiment, it is preferable that the deposited oxide film be formed by the low-pressure CVD process. The use of the low-pressure CVD process enables the deposited oxide film to have good film qualities and superior insulating properties, as compared to the atmospheric pressure method.

In the present embodiment, the lower electrode 3a is to be formed on a field oxide film 2 formed in the silicon substrate 1. It is to be noted that the low-pressure CVD process which can be preferably used in the present embodiment denotes CVD process performed under the environment with a pressure lower than the normal one in general, and does not define the pressure range in particular.

(A Manufacturing Method of the Semiconductor Device)

The manufacturing method of the semiconductor device according to the present embodiment will be described next.

FIG. 2-1 (a) to (c) and FIG. 2-2 (d) to (e) are cross-sectional views illustrative of the manufacturing method of the semiconductor device successively in accordance with the manufacturing processes, according to the present embodiment.

As illustrated in FIG. 2-1 (a), in the present embodiment, firstly, the field oxide film 2 for element isolation is formed in the silicon substrate 1. Then, a non-doped polysilicon film of 365 nm, not illustrated, is formed on the field oxide film 2. On the non-doped polysilicon film, a protective oxide film 4 for impurity implantation (doping) is formed by the low-pressure CVD process. The thickness of the protective oxide film 4 is 10 nm.

Next, in the present embodiment, the phosphorus ions are doped as impurities from the top of the protective oxide film 4. By doping the phosphorus ions, the non-doped polysilicon film on the field oxide film 2 becomes the polysilicon film 3 including the phosphorus ions of high concentration. This polysilicon film 3 will become the lower electrode 3a later. It is to be noted that, in the present embodiment, for example, the phosphorus ions are to be doped under the condition of 20 keV, 1.4×E16.

After that, in the present embodiment, the protective oxide film 4 is removed, as illustrated in FIG. 2-1 (b). The protective oxide film 4 is removed by, for example, successively washing for 40 seconds by a hydrogen fluoride solution of $HF:H_2O=1:19$, washing for 600 seconds by an ammonia-hydrogen peroxide mixture of $NH_3:H_2O:H_2O_2=1:10:2$ at 80 degrees Celsius, and washing for 50 seconds by a hydrogen fluoride solution of $HF:H_2O=1:99$ at 23 degrees Celsius.

Subsequently, in the present embodiment, the thermal treatment is performed for 14 seconds in the oxygen ambient atmosphere of 1050 degrees Celsius, and then the thermal oxide film 5 of 12 nm is formed on the polysilicon film 3. Such a formed thermal oxide film 5 is washed for 900 seconds by the ammonia-hydrogen peroxide mixture of $NH_3:H_2O:H_2O_2=1:10:2$ at 50 degrees Celsius, washed for 600 seconds by a hydrochloric acid-hydrogen peroxide mixture of $HCL:H_2O:H_2O_2=1:5:1$ at 80 degrees Celsius, and washed for 14 seconds by a hydrogen fluoride solution of $HF:H_2O=1:99$ at 23 degrees Celsius. When the wet etching amount by washing the thermal oxide film 5 is measured with an LCR meter as a capacitance value, it was 1.7 nm.

After washing, the deposited oxide film 6 of 10 nm is formed on the thermal oxide film 5. A deposited oxide film 6 is formed by the low-pressure CVD process under the condition of 670 degrees Celsius, 100 Pa. Next, the deposited oxide film 6 is thermally treated in the nitrogen atmosphere at 1050 degrees Celsius for 70 seconds. Then, as shown in FIG. 2-1 (c), in the present embodiment, the non-doped polysilicon film of 365 nm, not illustrated, is formed on the deposited oxide film 6. Phosphorus ions are also doped into the formed non-doped polysilicon film under the condition of 50 keV, 7.0×E15. By doping, the non-doped polysilicon film becomes a polysilicon film 7 including the phosphorus ions of high concentration.

After that, as illustrated in FIG. 2-2 (d), in the present embodiment, patterning is performed for the thermal oxide film 5, the deposited oxide film 6, and the polysilicon film 7 by photolithography and etching. The upper electrode 7a, the thermal oxide film 5a, and the deposited oxide film 6a are formed by patterning. Subsequently, as illustrated in FIG. 2-2 (e), in the present embodiment, patterning is performed for the polysilicon film 3 by photolithography and etching. Such a patterned polysilicon film 3 becomes the lower electrode 3a.

After the manufacturing processes described heretofore, the impurities are doped in the source-drain formation region, not illustrated. In this situation, the phosphorus ions doped into the upper electrode 7a are activated. Also, when the initial defect density of the semiconductor device manufactured according to the present embodiment was evaluated with a prober, it was 0.30 $cm^{-2}$.

EXPERIMENT EXAMPLES

The inventor of the present invention carried out experiments 1 to 3 by changing the etching conditions of the thermal oxide film 5 in the manufacturing process illustrated in FIG. 2-1 (b). In the experiments, the etching condition of the thermal oxide film 5 means only the washing (etching) condition by the hydrogen fluoride solution, from among the washing by the ammonia-hydrogen peroxide mixture, the hydrochloric acid-hydrogen peroxide mixture, and the hydrogen fluoride solution. For this reason, also in the experiments 1 to 3, the washing by the ammonia-hydrogen peroxide mixture and the hydrochloric acid-hydrogen peroxide mixture is performed in the same manner as the present embodiment. The etching conditions of the thermal oxide film 5 of the experiments 1 to 3 will be described as follows.

Experiment 1

The etching conditions of the experiment 1 (etching conditions 1) are set as follows.
Etchant: hydrogen fluoride solution
Etchant composition: $HF:H_2O=1:99$
Etchant temperature: 23 degrees Celsius
Etching time: 20 seconds In the experiment 1, the processes of FIG. 2-1(a) and FIG. 2-1(c) to FIG. 2-2(e) were carried out according to the above-described present embodiment. Then, the etching process of the thermal oxide film 5 illustrated in FIG. 2-1 (b) was performed by the above-described etching conditions 1 to manufacture the semiconductor device. The wet etching amount of the thermal oxide film 5 in the experiment 1 was measured with the LCR meter, and its amount was 1.9 nm. Also, when the initial defect density of the semiconductor device manufactured according to the present embodiment (the defect density immediately after the manufacturing) was evaluated with a prober, it was 0.12 $cm^{-2}$.

Experiment 2

The etching conditions of the experiment 2 (etching conditions 2) are set as follows.
Etchant: Hydrogen fluoride solution
Etchant composition: $HF:H_2O=1:99$
Etchant temperature: 23 degrees Celsius
Etching time: 26 seconds In the experiment 2, the processes of FIG. 2-1(a) and FIG. 2-1(c) to FIG. 2-2(e) were carried out according to the above-described present embodiment. Then, the etching process of the thermal oxide film 5 illustrated in FIG. 2-1(*b*) was performed by the above-described etching conditions 2 to manufacture the semiconductor device. The wet etching amount of the thermal oxide film 5 in the experiment 2 was measured with the LCR meter, and its amount was 2.3 nm. Also, when the initial defect density of the semiconductor device manufactured according to the present embodiment was evaluated with a prober, it was 0.06 cm$^{-2}$.

Experiment 3

The conditions of the etching of experiment 3 (etching conditions 3) are as follows.
Etchant: Hydrogen fluoride solution
Etchant composition: HF:H$_2$O=1:99
Etchant temperature: 23 degrees Celsius
Etching time: 34 seconds In the experiment 3, the processes of FIG. 2-1(*a*) and FIG. 2-1(*c*) to FIG. 2-2(*e*) were carried out according to the above-described present embodiment. Then, the etching process of the thermal oxide film 5 illustrated in FIG. 2-1(*b*) was performed by the above-described etching conditions 3 to manufacture the semiconductor device. The wet etching amount of the thermal oxide film 5 in the experiment 3 was measured with the LCR meter, and its amount was 2.7 nm. Also, when the initial defect density of the semiconductor device manufactured according to the present embodiment was evaluated with a prober, it was 0.06 cm$^{-2}$.

Comparative Example

Furthermore, the inventor of the present invention manufactured the semiconductor device according to the present embodiment without etching the thermal oxide film 5. Such a semiconductor device is used as a comparative example to verify the effects of the semiconductor device according to the present embodiment.

Figure 3:
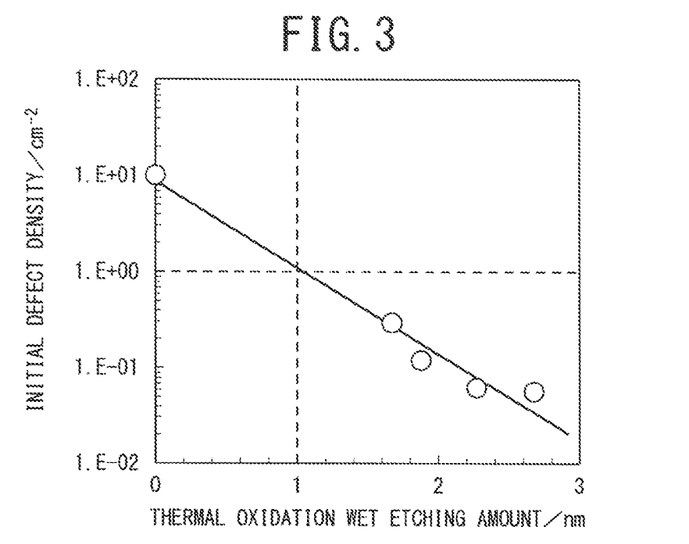
FIG. 3 is a graph indicative of a wet etching amount of the thermal oxide film and an initial defect density to represent effects of the present invention.

FIG. 3 illustrates a relationship between the wet etching amounts for the thermal oxide film 5 of the semiconductor device manufactured in the experiments 1 to 3 and the initial defect densities thereof, together with those of the comparative example. The vertical axis of FIG. 3 indicates the initial defect density, whereas the horizontal axis indicates the wet etching amount of the thermal oxide film 5.

As is apparent from FIG. 3, in the present embodiment, since the outer layer part of the thermal oxide film is etched out, it is made possible to reduce the initial defect density, as compared to a case where the outer layer part of the thermal oxide film is not etched out. It is also made possible to make the initial defect density equal to or less than 1.0 cm$^{-2}$ similar to that of the gate oxide film formed on the silicon substrate by making the wet etching amount equal to or more than 1 nm.

Figure 4:
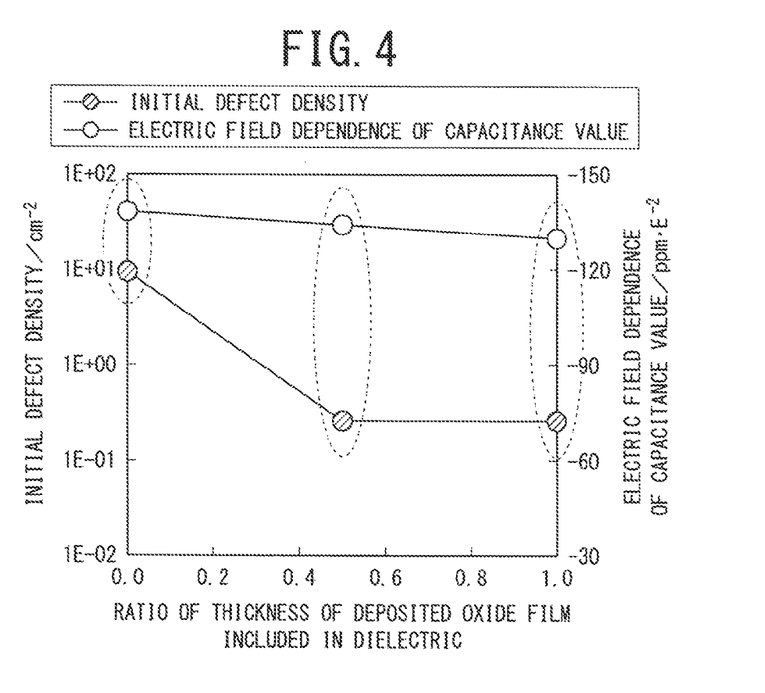
FIG. 4 is a graph indicative of thickness of a deposited oxide film included in the dielectric and the initial defect density and the electric field dependence.

FIG. 4 is a view illustrative of a relationship between a ratio of the deposited oxide film included in the dielectric film of the semiconductor device according to the embodiment 1, the initial defect density, and the electric field dependence of the capacitance value. The horizontal axis of FIG. 4 indicates a ratio of the deposited oxide film 6*a* in the dielectric film 10 illustrated in FIG. 1. The left end is (0.0) when a single layer of the thermal oxide film 5*a* constitutes the dielectric film 10, whereas the right end is (1.0) when a single layer of the deposited oxide film 6*a* constitutes the dielectric film 10. Also, the vertical axis on the left side of FIG. 4 indicates the initial defect density, whereas the vertical axis on the right side indicates the electric field dependence of the capacitance value.

In other words, among the plots in FIG. 4, the plot "•" illustrated at the left end indicates the initial defect density in a case where the single layer of the thermal oxide film 5*a* constitutes the dielectric film 10, whereas the plot "•" illustrated at the right end indicates the initial defect density in a case where the single layer of the deposited oxide film 6*a* constitutes the dielectric film 10. Also, among the plots in FIG. 4, the plot "○" illustrated at the left end indicates the electric field dependence of the capacitance value in the case where the single layer of the thermal oxide film 5*a* constitutes the dielectric film 10, whereas the plot "○" illustrated at the right end indicates the electric field dependence of the capacitance value in the case where the single layer of the deposited oxide film 6*a* constitutes the dielectric film 10.

The plot "•" between the above-described plots indicates the initial defect density of the dielectric film 10 including the thermal oxide film 5*a* and the deposited oxide film 6*a*, respectively by 50%, whereas the plot "○" indicates the electric field dependence of the capacitance value of the dielectric film 10 including the thermal oxide film 5*a* and the deposited oxide film 6*a*, respectively by 50%. It is to be noted that the etched out amount of the thermal oxide film 5*a* ranges from the surface of the thermal oxide film 5 to 1.9 nm in the depth direction.

As is apparent from FIG. 4, the single layer of the thermal oxide film 5*a* had the initial defect density of 9.10 cm$^{-2}$, and had the electric field dependence of the capacitance value of −138 ppm/E$^2$. In addition, the single layer of the deposited oxide film 6*a* had the initial defect density of 0.10 cm$^{-2}$, and had the electric field dependence of the capacitance value of −130 ppm/E$^2$. Furthermore, when the dielectric film 10 included the deposited oxide film 6*a* by 50% and the thermal oxide film 5*a* by 50%, respectively, the initial defect density was 0.12 cm$^{-2}$ and the electric field dependence of the capacitance value was −133 ppm/E$^2$. It is to be noted that the electric field dependence of capacitance value was evaluated with a prober.

As is apparent from FIG. 4, in the case of including the thermal oxide film 5*a* and the deposited oxide film 6*a*, respectively by 50%, phosphorous of high concentration originating from the lower electrode 3*a* incorporated into the dielectric film 10 by thermal oxidization is removed by wet etching. This makes it possible to keep the impurity concentration high near the surface of the lower electrode 3*a*, and also to suppress the electrode depletion in the application of a voltage. In other words, according to the present embodiment, it is possible to achieve the semiconductor device that is a two-layered polysilicon capacitive element which can suppress both of an increase in the applied voltage dependency of the capacitance value and the initial defect.

It is to be noted that, according to FIG. 4, also in the case where the single layer of the deposited oxide film 6*a* constitutes the dielectric film 10, the impurities in polysilicon to be the lower electrode 3*a* are not incorporated into the dielectric film 10. Accordingly, the degradation of the breakdown voltage of the dielectric film 10 can be suppressed. However, in the case where the single layer of the deposited oxide film 6*a* constitutes the dielectric film 10, there is a drawback that the reliability falls as will be described below.

Figure 5:
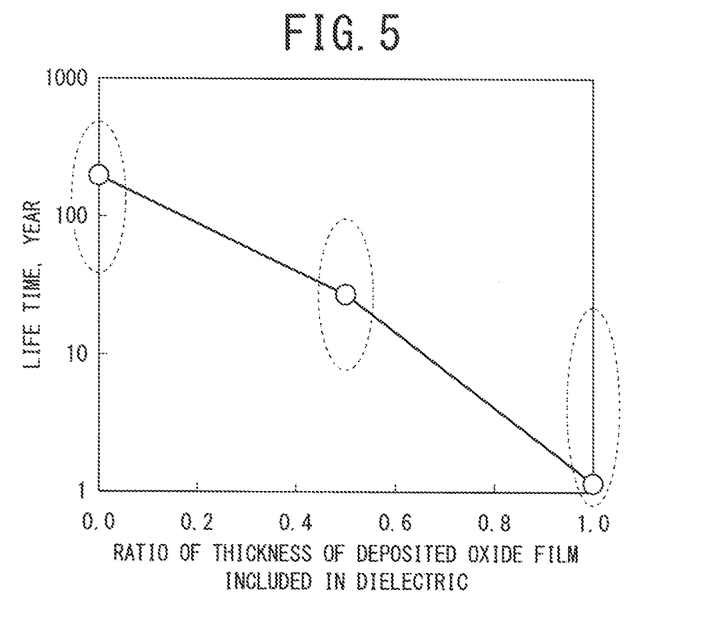
FIG. 5 is a graph indicative of an intrinsic breakdown lifetime for each dielectric structure.

FIG. 5 is a view illustrative of a relationship between the ratio of the deposited oxide film 6*a* included in the dielectric film 10 and the life time of the two-layered capacitive element. The horizontal axis of FIG. 5 indicates a ratio of the deposited oxide film 6*a* in the dielectric film 10 illustrated in FIG. 1. The left end is (0.0) when the single layer of the thermal oxide film 5*a* constitutes the dielectric film 10, whereas the right end is (1.0) when the single layer of the deposited oxide film 6*a* constitutes the dielectric film 10. Also, the vertical axis of FIG. 5 indicates the life time of the semiconductor device according to the present embodiment, in the case of using the dielectric film having the composition corresponding to the horizontal axis. It is to be noted that the life time of the semiconductor device was evaluated based upon the actual measurement with a prober.

That is to say, among the plots in FIG. 5, the plot "•" illustrated at the left end indicates the life time of the semiconductor device according to the present embodiment in the case where the single layer of the thermal oxide film 5a constitutes the dielectric film 10, whereas the plot "•" illustrated at the right end indicates the life time in the case where the single layer of the deposited oxide film 6a constitutes the dielectric film 10. The plot "•" between the above-described plots indicates the life time of the semiconductor device according to the present embodiment in the case where the dielectric film 10 includes the thermal oxide film 5a and the deposited oxide film 6a, respectively by 50%. It is to be noted that, also in FIG. 5, the thermal oxide film 5a is etched out in a range from the surface of the thermal oxide film 5 to 1.9 nm in the depth direction.

As indicated in FIG. 5, the life time of the semiconductor device was 197 years in the case where the single layer of the thermal oxide film 5a constituted the dielectric film 10, whereas the life time thereof was one year in the case where the single layer of the deposited oxide film 6a constituted the dielectric film 10. Further, the life time of the dielectric film 10 was 27 years in the case where the dielectric film 10 included the thermal oxide film 5a and the deposited oxide film 6a, respectively by 50%. Based upon the foregoing, in the case where the deposited oxide film 6a constitutes the dielectric film 10, the intrinsic breakdown life time of the semiconductor device drastically degrades (life time is one year) and it is apparent that ensuring of the reliability becomes difficult.

In contrast, according to the present embodiment, it is possible to achieve the semiconductor device, in which the dielectric film 10 including both of the thermal oxide film 5a and the deposited oxide film 6a is used and the outer layer part of the thermal oxide film is etched out, so that both of an increase in the applied voltage dependency of the capacitance value and the initial defect can be suppressed and the degradation of the intrinsic breakdown life time can be suppressed.

According to the semiconductor device and the manufacturing method of the semiconductor device, according to the present embodiment described heretofore, it is possible to suppress the impurity concentration in the whole dielectric film, even if the impurities of high concentration are doped into the polysilicon film. Accordingly, it is possible to suppress an increase in the applied electric field dependency of the capacitance value. Further, since the whole dielectric film can be constituted of an oxide film, the defect of the dielectric film can be reduced more than the case where a silicon nitride film is used for the dielectric film. This improves the breakdown voltage.

INDUSTRIAL APPLICABILITY

The present invention described heretofore is suitable for a two-layered polysilicon capacitive element having polysilicon with its resistance lowered and a silicon oxide film as a dielectric, and a manufacturing method of the two-layered polysilicon capacitive element.

REFERENCE SIGNS LIST

1 silicon substrate
2 field oxide film
3, 7 polysilicon film
3a lower electrode
4 protective oxide film
5, 5a thermal oxide film
6, 6a deposited oxide film
7a upper electrode
10 dielectric film

The invention claimed is:

1. A manufacturing method of a semiconductor device, comprising processes of:
   forming a first polysilicon film on a field oxide film formed on a substrate;
   implanting impurities into the first polysilicon film;
   oxidizing the first polysilicon film to form a thermal oxide film;
   wet etching a whole surface of the thermal oxide film in a depth direction;
   forming a deposited oxide film on the thermal oxide film that is wet etched; and
   forming a second polysilicon film on the deposited oxide film.

2. The manufacturing method of the semiconductor device according to claim 1, further comprising processes of:
   patterning the second polysilicon film, the thermal oxide film, and the deposited oxide film to form an upper electrode and a dielectric film; and
   patterning the first polysilicon film to form a lower electrode.

3. The manufacturing method of the semiconductor device according to claim 2, wherein in the process of forming the thermal oxide film, the thermal oxide film having thickness of substantially 12 nm is formed at a temperature of 1050 degrees Celsius.

4. The manufacturing method of the semiconductor device according to claim 1, wherein in the process of etching the thermal oxide film, wet etching is performed by: an ammonia-hydrogen peroxide mixture of $NH_3(aq):H_2O:H_2O_2=1:10:2$ at 50 degrees Celsius; a hydrochloric acid-hydrogen peroxide mixture of $HCL:H_2O:H_2O_2=1:5:1$ at 80 degrees Celsius; and a hydrogen fluoride solution of $HF:H_2O=1:99$ at 23 degrees Celsius, or wet etching is performed by only the hydrogen fluoride solution of $HF:H_2O=1:99$ at 23 degrees Celsius, to etch out the thermal oxide film from an outermost surface to a range of 1 nm or more to 4 nm or less.

5. The manufacturing method of the semiconductor device according to claim 1, wherein in the process of forming the deposited oxide film, the deposited oxide film having thickness of substantially 10 nm is formed by using low-pressure Chemical Vapor Deposition (CVD) process under a condition of pressure 100 Pa, at 670 degrees Celsius.

6. The manufacturing method of the semiconductor device according to claim 1, wherein, in the process of wet etching the thermal oxide film is etched out from an outermost surface to a range of 1 nm or more to 4 nm or less.

7. The manufacturing method of the semiconductor device according to claim 1, wherein, in the process of the wet etching, the whole surface of the thermal oxide film is wet etched by washing by an ammonia-hydrogen peroxide mixture, a hydrochloric acid-hydrogen peroxide and a hydrogen fluoride solution.

8. The manufacturing method of the semiconductor device according to claim 1, wherein the semiconductor device is a capacitance.

* * * * *